United States Patent
Lee et al.

[11] Patent Number: 5,891,354
[45] Date of Patent: Apr. 6, 1999

[54] METHODS OF ETCHING THROUGH WAFERS AND SUBSTRATES WITH A COMPOSITE ETCH STOP LAYER

[75] Inventors: Michael G. Lee, San Jose; Solomon I. Beilin, San Carlos; William T. Chou, Cupertino; Michael G. Peters, San Clara; Wen-chou Vincent Wang, Cupertino, all of Calif.

[73] Assignee: Fujitsu Limited, Hong Kong

[21] Appl. No.: 687,723

[22] Filed: Jul. 26, 1996

[51] Int. Cl.⁶ .............................. B44C 1/22; H05K 3/06
[52] U.S. Cl. .............................. 216/99; 216/41; 216/100; 216/108; 438/597; 438/619; 438/753; 438/756; 438/757
[58] Field of Search ..................... 438/694, 745, 438/753, 756, 757, 597, 611, 618, 619; 216/41, 83, 99, 100, 108

[56] References Cited

U.S. PATENT DOCUMENTS

| | | | |
|---|---|---|---|
| 3,536,547 | 10/1970 | Schmidt | 438/694 |
| 3,926,715 | 12/1975 | Süssman | 117/95 |
| 4,430,153 | 2/1984 | Gleason et al. | 438/705 |
| 4,440,729 | 4/1984 | Jönsson | 216/93 |
| 4,539,392 | 9/1985 | Kadoi | 528/336 |
| 4,600,934 | 7/1986 | Aine et al. | 428/450 |
| 4,648,179 | 3/1987 | Bhattacharyya et al. | 29/832 |
| 4,671,850 | 6/1987 | Shimkunas | 216/41 |
| 4,784,721 | 11/1988 | Holmen et al. | 216/2 |
| 5,055,907 | 10/1991 | Jacobs | 257/773 |
| 5,201,987 | 4/1993 | Hawkins et al. | 216/2 |
| 5,229,916 | 7/1993 | Frankeny et al. | 361/718 |
| 5,308,442 | 5/1994 | Taub et al. | 216/27 |
| 5,369,299 | 11/1994 | Byrne | 257/638 |
| 5,376,586 | 12/1994 | Beilin et al. | 427/496 |
| 5,670,062 | 9/1997 | Lin et al. | 216/108 |

*Primary Examiner*—Bernard P. Codd
*Attorney, Agent, or Firm*—Coudert Brothers

[57] ABSTRACT

Methods of wet etching through a silicon substrate using composite etch-stop layers are disclosed. In one embodiment, the composite etch stop comprises a layer of silicon dioxide and a layer of polyimide.

20 Claims, 5 Drawing Sheets even with a cracked first layer, the polymeric layer is etched at a lower rate than would occur if the polymeric layer were fully exposed to the etchant due to the fact that the etchant's active reagent must diffuse through the crack to reach the polymeric material. Such diffusion acts to limit the etchant's reaction rate. In preferred embodiments of the present invention, the polymeric layer is cured to increase its etch resistance.

METHODS OF ETCHING THROUGH WAFERS AND SUBSTRATES WITH A COMPOSITE ETCH STOP LAYER

FIELD OF THE INVENTION

The present invention relates to methods of etching silicon, and in particular to methods of etching through a wafer or substrate, from a first surface to a second surface, with an etch-stop layer at the second surface.

BACKGROUND OF THE INVENTION

The etching of silicon has been widely applied in the semiconductor industry. Common forms of silicon etching are by plasma etch and wet chemical etch. Plasma etching enables fine features to be formed in the silicon, but is relatively expensive. Wet chemical etching is less expensive, but produces coarser features.

In some applications, a silicon wafer is etched from the back surface with a wet chemical etch process such that some portions of the silicon extending from the back surface to the front surface are removed. In these processes, a layer of silicon dioxide ($SiO_2$) or silicon nitride ($Si_3N_4$) is usually formed over the front surface of the silicon wafer as an etch stop. Typical silicon etchants attack these materials at a much slower rate than silicon.

Silicon dioxide and silicon nitride layers work adequately as long as the removed portions of silicon are relatively small. However, these materials have been found to crack and break apart when larger portions of silicon are removed, which is often catastrophic to the overall fabrication process. As is known in the art, the underlying silicon wafer places a significant amount of tangential stress on silicon dioxide and nitride layers which are formed over its surface. Oxide and nitride layers ($SiO_2$ and $Si_3N_4$) are formed over the silicon wafer by high temperature processes (usually >700° C.), and have coefficients of thermal expansion (CTE) which are smaller than that of silicon. Upon cooling to room temperature, the oxide and nitride layers prefer to contract at a slower rate than the underlying silicon wafer. However, because the silicon wafer is thicker than these layers, the silicon wafer determines the overall lateral contraction rate and thereby compresses these layers in the tangential direction. When the silicon under a large area of a $SiO_2$ or $Si_3N_4$ layer is etched away, the tangential stress in the layer causes the layer to bow outwards in the vertical direction. With sufficient bowing, the layer cracks or breaks.

Accordingly, there is a need for an etch-stop layer that can be used for the removal of large portions of silicon.

SUMMARY OF THE INVENTION

Broadly stated, the present invention encompasses composite etch-stop layers and methods for using the same in etching wafers and substrates, which are particularly well suited to the etching of silicon wafers, but which may be used on other substrate materials. The composite etch-stop layers according to the present invention comprise a first layer of material which is etch resistant to the wafer's etchant, and a second layer which may be less etch-resistant than the first layer, but which provides the first layer with mechanical support to prevent the first layer from breaking apart during the etching operation. The composite etch-stop layers are oriented such that the first layer is first to contact the etchant once the etchant etches through the wafer. The second layer preferably comprises a polymeric material. The polymeric layer provides mechanical support such that, in the worst case, the first layer cracks but does not break away from the wafer. Even with a cracked first layer, the polymeric layer is etched at a lower rate than would occur if the polymeric layer were fully exposed to the etchant due to the fact that the etchant's active reagent must diffuse through the crack to reach the polymeric material. Such diffusion acts to limit the etchant's reaction rate. In preferred embodiments of the present invention, the polymeric layer is cured to increase its etch resistance.

For the etching of silicon wafers, the first layer preferably comprises silicon dioxide or silicon nitride, and the second layer preferably comprises a cured polyimide layer. For the etching of molybdenum, the first layer preferably comprises chromium and the second layer preferably comprises a cured polyimide layer.

DETAILED DESCRIPTION OF THE INVENTION

Figure 1:
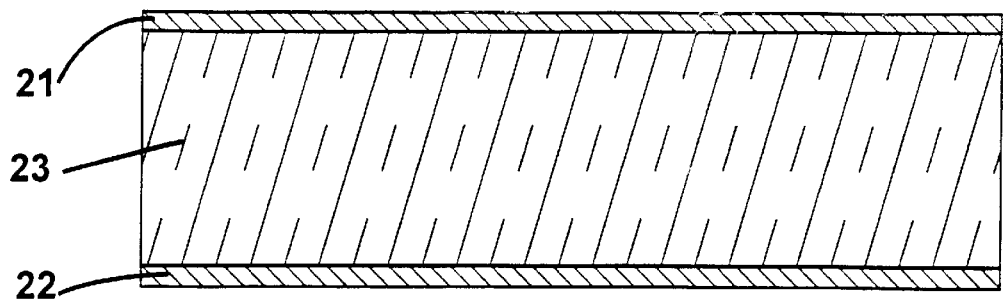
FIGS. 1–6 are cross-sectional views of a wafer during various steps according to the etching methods of the present invention where a composite etch-stop layer according to the present invention is employed.

FIG. 1 shows a cross-sectional view of a silicon wafer 23 which has two etch-resistant layers 22 and 21 formed on the front and back surfaces of wafer 23. In FIG. 1 and subsequent FIGS. 2–6, wafer 23 is oriented in the reverse orientation with the back surface above the front surface. Additionally, the vertical dimension of wafer 23 and the various layers formed thereon shown in these figures is expanded by a factor of approximately 10 to better show the features of the invention. In one construct embodiment of the present invention, layers 21 and 22 comprise silicon dioxide ($SiO_2$) and are formed by oxidizing wafer 23 to produce a 2 μm-thick layer of oxide on each surface. Layers 21 and 22 may also be formed by chemical vapor deposition (CVD) of silicon dioxide. Silicon nitride may also be used, which can be readily deposited by CVD. When comprised of silicon dioxide, layers 21 and 22 are preferably at least 0.1 μm thick, and generally range between 0.5 μm and 4 μm in thickness. When comprised of silicon nitride, layers 21 and 22 are preferably at least 0.02 μm (200 Å) thick, and generally range between 0.05 μm (500 Å) and 0.2 μm (2,000

Å) in thickness. These layers are much thicker than the thickness of a native oxide, which is approximately 0.002 $\mu$m (20 Å).

Figure 2:
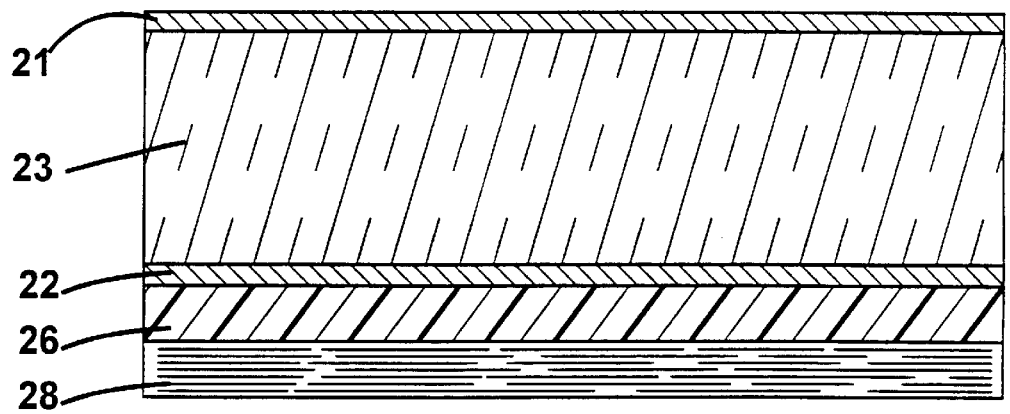

Next, as shown in FIG. 2, a layer 26 of polymeric material is formed over etch-resistant layer 22. Polymeric materials are generally less resistant to liquid silicon etchants than silicon dioxide or silicon nitride, and are generally more elastic. Polymeric layer 26 is at least 2 $\mu$m thick, and generally ranges between 4 $\mu$m and 16 $\mu$m in thickness. Polymeric layer 26 is preferably cured by any of the curing methods according to the art to make it more etch resistant. For example, heat treatment (usually in excess of 300° C.), ultra-violet light radiation, electron beam radiation, and a combination of any of these treatments may be used. In one constructed embodiment (the same where layers 21 and 22 comprise 2 $\mu$m-thick $SiO_2$), layer 26 comprises a polyimide (DUPONT 2611) which is around 8 $\mu$m in thickness, and is cured to a temperature of 400° C. A typical curing process comprises raising the temperature to 150° C. over a time of approximately 15 minutes, baking the layer at 150° C. for approximately 60 minutes, then ramping the temperature to 400° C. over approximately 100 minutes, baking at this temperature for approximately 30 minutes, and then ramping down to 120° C. over approximately 2 hours. The polymeric layer is preferably cured to a temperature of at least 250° C., and more preferably to a temperature of 300° C., if temperature curing is employed. As an option, the polyimide may be further cured by exposure to electron beam radiation.

Various circuit layers 28 may then be formed on the exposed surface of polymeric layer 26. The character of these layers 28 depends upon the specific application for the processed wafer. Layers 28 do not form a part of the present invention.

Figure 3:
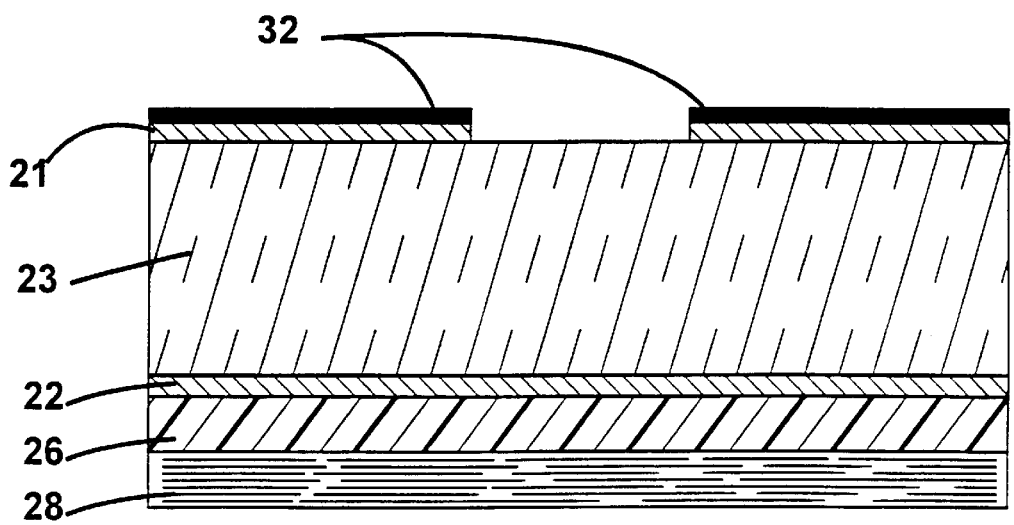

Next, as shown in FIG. 3, a portion of etch-resistant layer 21 at the back surface of wafer 23 is removed, which will later enable the liquid etchant to penetrate and remove an underlying portion of the silicon wafer. The portion of layer 21 may be removed by conventional photoresist and etching methods wherein a photoresist layer 32 is formed over layer 21, pattern exposed and developed, and wherein the exposed portion of layer 21 is exposed to a suitable etchant. Buffered hydrofluoric acid (HF) may be used to wet-etch both silicon dioxide and silicon nitride, and orthophosphoric acid ($H_3PO_4$) may be used to wet-etch silicon nitride. As an example, a 2 $\mu$m-thick layer of silicon dioxide may be etched by a 10% hydrofluoric acid solution at room temperature for approximately 40 minutes. Although currently more expensive, dry etching may also be used to remove the exposed portion of layer 21. Finally, it may be appreciated that the removal of the portion of layer 21 may precede the formation of circuit layers 28, and may also precede the formation of polymeric layer 26.

Figure 4:
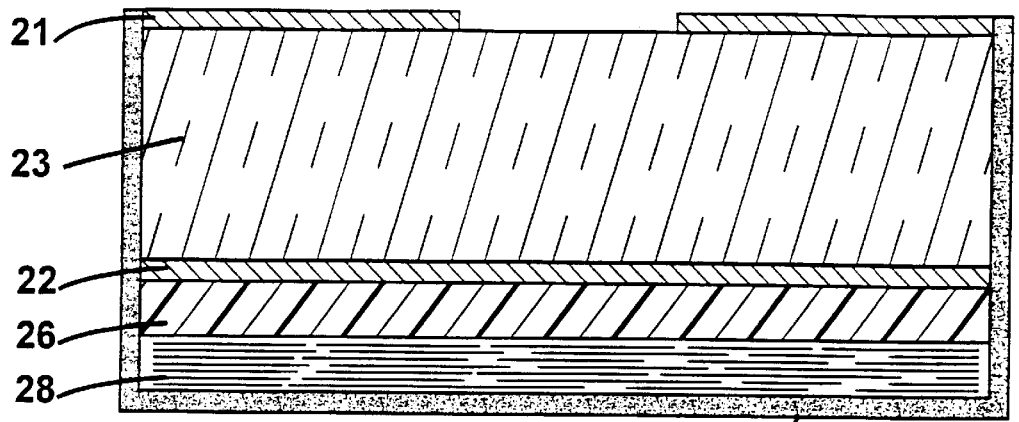

Next, as shown in FIG. 4, the edges and front surface of wafer 23 are coated with a layer 34 of a protective wax compound (such as a black wax, carnauba, etc.), which protects circuit layers 28 from the silicon etchant (i.e., substantially prevents the etchant from contacting the layers on the front surface of the wafer). Such wax compounds are relatively resistant to silicon etchants as well as many other etchants. (These waxes have relatively low melting points of around 85° C., which prevents them from being used for etch-resistant layer 22 since the formation of the circuit layers 28 over layer 22 generally involve temperatures well above 85° C.) Protective-wax layer 34 may be applied by standard spin-coating techniques, followed by baking to remove the base solvent used to fluidize the wax. It may be appreciated that the formation of protective-wax layer 34 may precede the above etching of the portion of layer 21, particularly when a wet-etch process is employed. In such a case, layer 34 protects circuit layers 28 from the etchant for layer 21 when the etchant is not compatible with the composition of circuit layers 28.

Figure 5:
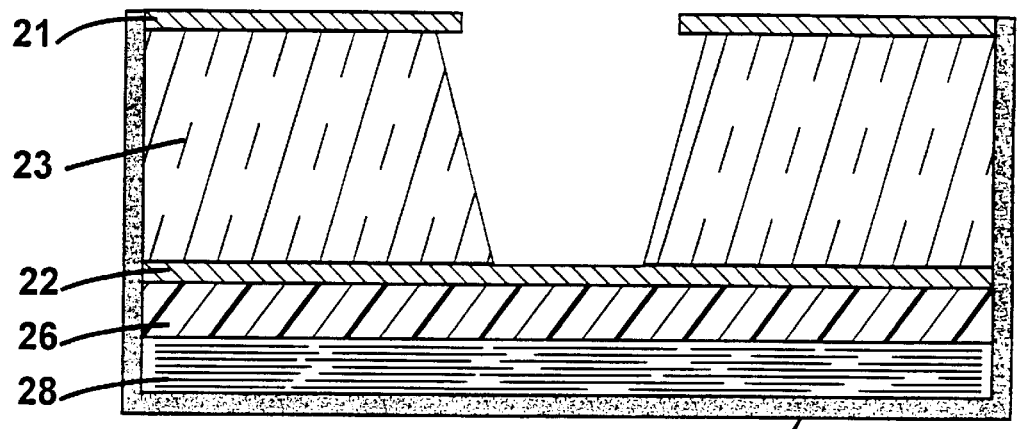

Next, as shown in FIG. 5, the exposed portions of silicon wafer 23 are exposed to a silicon etchant. The etchant may be a hot aqueous solution of 30% by weight of potassium hydroxide (KOH), the solution being around 65° C. in temperature. For a wafer thickness of 675 $\mu$m, the etch time is around 24 hours. Other silicon etchants may be used, such as for example sodium hydroxide (NaOH), a combination of aqueous hydrofluoric acid (HF) and nitric acid ($HNO_3$), an aqueous solution of pyrocatechol ($C_6H_6O_2$) and ethylenediamine ($H_2NCH_2CH_2NH_2$), or a hydrazine ($H_2NNH_2$) aqueous solution.

Figure 6:
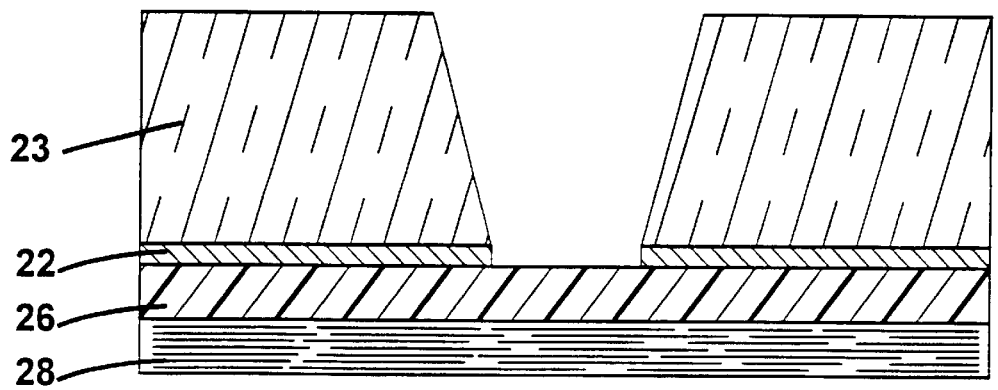

Wafer 23 is then removed from the silicon etchant and rinsed. The resulting structure is shown in FIG. 5, where the selective removal of the silicon has left a portion of layer 22 exposed. If desired, the exposed portion of second layer 22 and the remainder of layer 21 may be removed by a suitable etchant. For example, buffered hydrofluoric acid (HF) may be used to wet-etch both silicon dioxide and silicon nitride, and orthophosphoric acid ($H_3PO_4$) may be used to wet-etch silicon nitride. In the embodiment where layers 21 and 22 each comprise a 2 $\mu$m-thick layer of silicon dioxide, the layers may be removed by exposure to a 10% hydrofluoric acid solution at room temperature for approximately 40 minutes. Protective-wax layer 34 may be removed by a suitable solvent, such as xylene ($C_8H_{10}$). The structure that results with the removal of layers 21, 22, and 34 is shown in FIG. 6.

Figure 7:
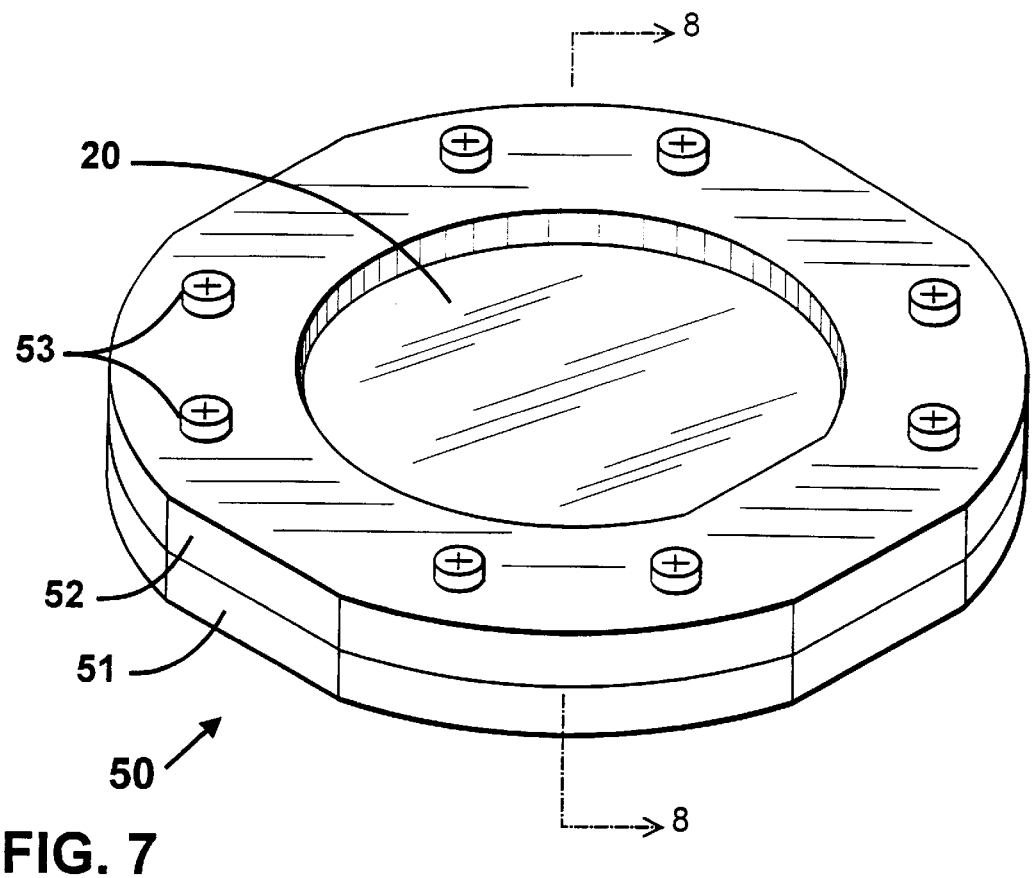
FIG. 7 is an isometric view of a wet-etch fixture which may be employed in the methods according to the present invention.
Figure 8:
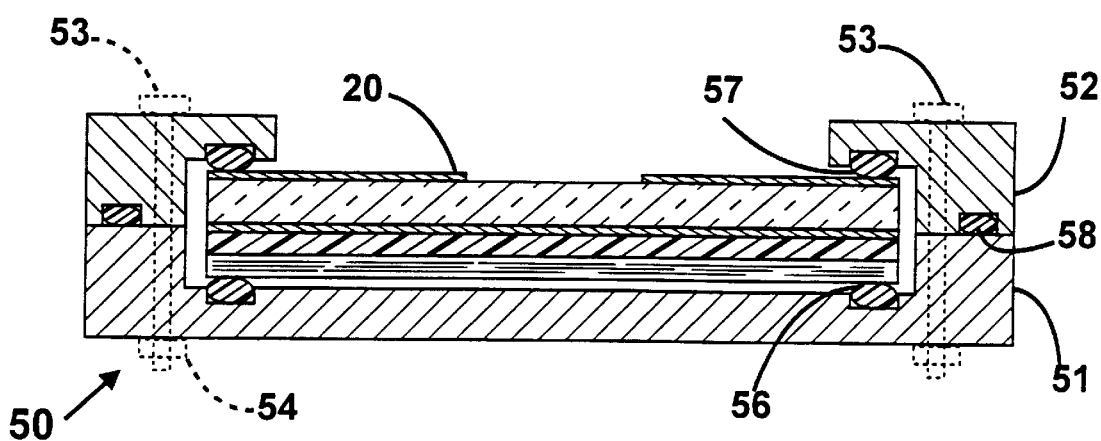
FIG. 8 is a cross-sectional view of the wet-etch fixture shown in FIG. 7.

In place of using protective-wax layer 34, the circuit layer 28 at the front surface of wafer 23 may be protected by a wet-etch fixture 50 according to the present invention, which is shown in isometric view in FIG. 7 and in cross-sectional view in FIG. 8. Fixture 50 comprises a bottom plate 51 and a top plate 52, each of which is generally circular, and which are clamped together by a plurality of bolts 53 and nuts 54. Both plates 51 and 52 have major recesses formed in their confronting surfaces, which provide space to accept the circuitized wafer, which is designated by reference number 20 in FIGS. 7 and 8. Top plate 52 has an aperture formed concentrically through its body, which exposes the back surface of circuitized wafer 20. Wafer 20 is spaced from each of plates 51 and 52 by respective O-rings 56 and 57. O-rings 56 and 57 are disposed in respective circular recesses in plates 51 and 52, and are under compression against wafer 20 when plates 51 and 52 are clamped together. O-ring 56 forms a seal around the periphery of the front surface of wafer 20 which substantially prevents the silicon etchant from contacting the front surface. To prevent etchant from attacking the sides of wafer 23, a third O-ring 58 may be used around the peripheral edges of plates 51 and 52, at their confronting surfaces. One of the plates, such as plate 52, may have a circular recess for accommodating O-ring 58. O-rings 56 and 58 work together to prevent etchant from contacting and attaching the side of wafer 23. Plates 51 and 52, bolts 53, nuts 54, and O-rings 56–58 comprise materials which are not substantially attacked by the silicon etchant. Plates 51 and 52 may comprise NORYL plastic (manufactured by General Electric Corporation) or stainless steel, bolts 52 and nuts 54 may comprise stainless steel, and O-rings 56–58 may comprise ethylene polypropylene rubber. Other fasteners, such as C-shaped spring clips, may be used in place of bolts 53 and nuts 54.

Figure 9:
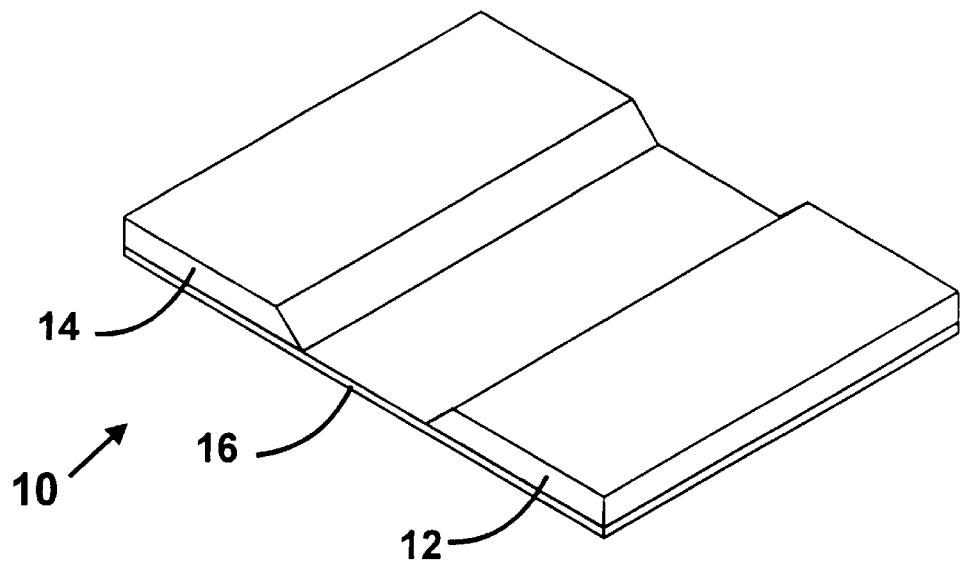
FIG. 9 is an isometric view of a connector which may be fabricated by the methods according to the present invention, the connector showing an exemplary application of the present invention.
Figure 10:
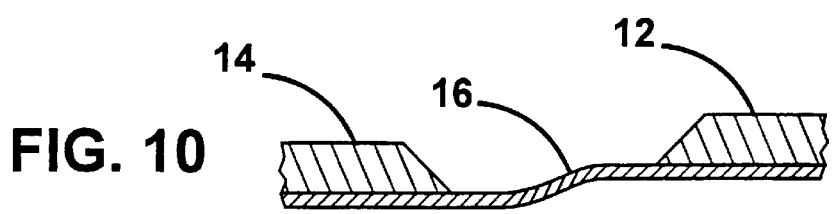
FIG. 10 is a cross-sectional view of the connector shown in FIG. 9 where the two distal members of the connector are at different heights.
Figure 11:
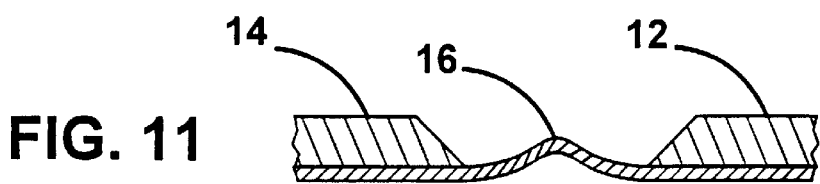
FIG. 11 is a cross-sectional view of the connector shown in FIG. 9 where the two distal members of the connector are closer together than anticipated.
Figure 12:
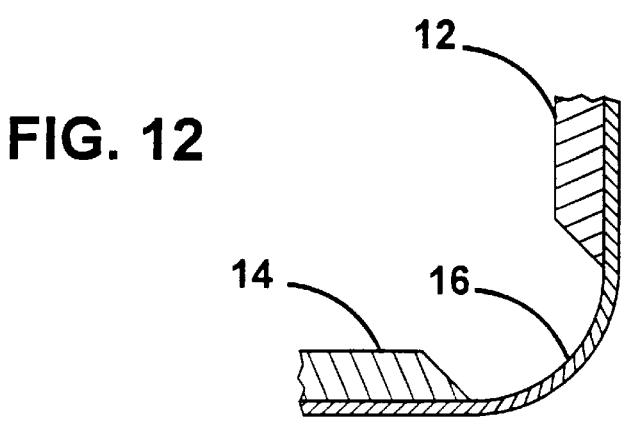
FIG. 12 is a cross-sectional view of the connector shown in FIG. 10 where the two distal members of the connector are positioned at a right angle to one another.

One application of the etching methods according to the present invention is to form a thin-film connector, such as that shown at 10 in FIG. 9. Thin-film connector 10 comprises two silicon substrates 12 and 14 which are each coupled to a thin-film layer 16, which comprises interleaved layers of metal and dielectric, such as copper/polyimide. Layer 16 generally comprises a first set of contact pads overlying substrate 12, a second set of contact pads overlying substrate 14, and electrical traces running between each of the sets. The thin-film layer 16 enables connector 10 to attach to corresponding elements which are at different heights (FIG. 10), or which are spaced more closely together than anticipated (FIG. 11), or which are at right angles to one another (FIG. 12).

Figure 13:
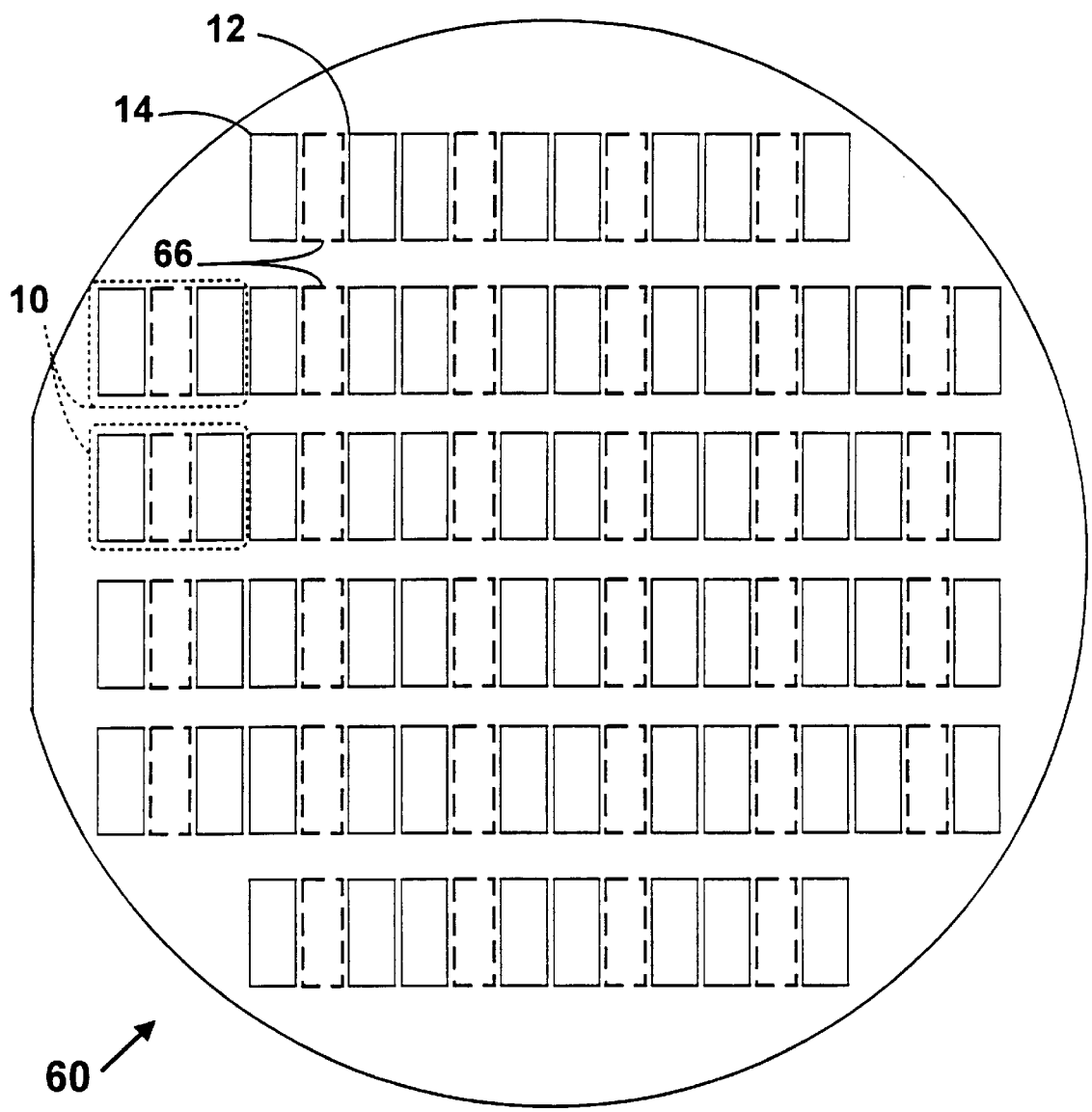
FIG. 13 is a top plan view of a wafer on which a plurality of the connectors shown in FIG. 9 may be simultaneously constructed.

Connector 10 is constructed by first forming thin-film layer 16 over a silicon wafer, and then etching, from the back side of the wafer, a portion of the silicon that is between substrates 12 and 14, with the methods according to the present invention. FIG. 13 shows a top plan view of a single silicon wafer 60 which has a plurality of connectors 10 laid out thereon. The portions of silicon to be removed are shown as portions 66, which are indicated in dashed lines. Once fully fabricated, the individual connectors 10 are separated from the wafer 60 by conventional dicing (e.g., sawing) methods.

While the present invention has been particularly described with respect to the illustrated embodiments, it will be appreciated that various alterations, modifications and adaptations may be made based on the present disclosure, and are intended to be within the scope of the present invention. For example, while silicon wafers have been used to illustrate the present invention, molybdenum wafers may be used, using chromium for layers 21 and 22, cured polyimide for second layer 26, and a mixture of 17% sulfuric acid and 17% nitric acid (in water) as an etchant. The molybdenum etchant takes approximately 60 minutes to etch through 625 $\mu$m of molybdenum.

While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method of etching through a wafer from a first surface thereof to a second surface thereof using a liquid chemical etchant, said wafer having a plurality of electrical traces formed at its second surface and overlying an area of the wafer which is to be etched away by said method, the traces are to be protected from exposure to the liquid chemical etchant, said method comprising the steps of:
   (a) forming on each wafer surface a layer of material which is etch-resistant to the liquid chemical etchant before the electrical traces are formed;
   (b) forming over said etch-resistant layer at said second surface a layer of polymeric material before the electrical traces are formed;
   (c) removing a portion of said etch-resistant layer at said first surface; and
   (d) after the electrical traces are formed, exposing said wafer to the liquid chemical etchant such that said etchant does not contact the electrical traces at the second surface of the wafer.

2. The method of claim 1 wherein said etch-resistant layer at the second wafer surface comprises silicon dioxide.

3. The method of claim 2 wherein said at least one etch-resistant layer which comprises silicon dioxide is between 0.5 $\mu$m and 4 $\mu$m in thickness.

4. The method of claim 1 wherein said wafer comprises silicon and wherein said step (a) further comprises the step of oxidizing the second surface of said wafer to form said etch-resistant layer thereat.

5. The method of claim 1 wherein each said etch-resistant layer is at least 0.1 $\mu$m thick.

6. The method of claim 1 wherein said etch-resistant layer at the second wafer surface comprises silicon nitride.

7. The method of claim 1 wherein said step (b) of forming said polymeric layer further comprises the step of curing said polymeric layer.

8. The method of claim 7 wherein said step of curing said polymeric layer comprises the step of exposing said layer to an elevated temperature of at least 300° C.

9. The method of claim 7 wherein said step of curing said polymeric layer comprises the step of exposing said layer to electron-beam radiation.

10. The method of claim 1 wherein said polymeric material is less etch-resistant than said etch-resistant layer.

11. The method of claim 1 wherein said polymeric material comprises a polyimide.

12. The method of claim 1 wherein said polymeric layer is between 4 $\mu$m and 16 $\mu$m in thickness.

13. The method of claim 1 wherein the step of exposing the wafer to the liquid chemical etchant comprises the step of coating the second surface of the wafer with a wax prior to exposing the wafer to said liquid chemical etchant, said wax being resistant to said liquid chemical etchant.

14. The method of claim 1 wherein the step of exposing the wafer to the liquid chemical etchant further comprises the step of placing the wafer in a wet-etch fixture prior to exposing said wafer to the liquid chemical etchant, said fixture sealing the second surface of said wafer from exposure to said liquid chemical etchant.

15. The method of claim 1 wherein said liquid chemical etchant comprises an aqueous solution of potassium hydroxide.

16. The method of claim 1 wherein said wafer comprises molybdenum, and wherein said etch-resistant layer at the second wafer surface comprises chromium.

17. The method of claim 16 wherein said liquid chemical etchant comprises sulfuric acid and nitric acid.

18. A method of etching through a silicon wafer from a first surface of the wafer to a second surface thereof using a chemical etchant, said wafer having a plurality of electrical traces formed at its second surface and overlying an area of the wafer which is to be etched away by said method, the traces are to be protected from exposure to the chemical etchant, said method comprising the steps of:
   (a) forming a layer of silicon dioxide on each surface of said wafer before the electrical traces are formed;
   (b) forming a layer of polyimide over the oxide layer on the wafer's second surface before the electrical traces are formed;
   (c) curing said polyimide layer;
   (d) removing a portion of the oxide layer on the first surface of the wafer;
   (e) after the electrical traces are formed, exposing the wafer to a silicon etch solution such that solution does not etch the electrical traces at the second surface of the wafer.

19. A method of etching through a wafer from a first surface thereof to a second surface thereof using a liquid chemical etchant to form a thin-film connector, said method comprising the steps of:
  (a) forming on each wafer surface a layer of material which is etch-resistant to the liquid chemical etchant;
  (b) forming over said etch-resistant layer at said second surface a layer of polymeric material;
  (c) forming a plurality of electrical traces over the layer of polymeric material, said electrical traces overlying an area of the wafer which is to be etched, said traces are to be protected from exposure to the liquid chemical etchant;
  (d) removing a portion of said etch-resistant layer at said first surface; and
  (e) after the electrical traces are formed, exposing said wafer to the liquid chemical etchant such that said etchant does not contact the electrical traces at the second surface of the wafer.

20. The method of claim 19 wherein said polymeric layer is between 4 $\mu$m and 16 $\mu$m in thickness.

* * * * *

UNITED STATES PATENT AND TRADEMARK OFFICE
CERTIFICATE OF CORRECTION

PATENT NO. : 5,891,354
DATED : April 6, 1999
INVENTOR(S) : Lee et al.

It is certified that error appears in the above-indentified patent and that said Letters Patent is hereby corrected as shown below:

In the cover page of the letters patent [73] Assignee, delete "Hong Kong" and insert therefor --Japan--.

In the ABSTRACT, line 3, delete "etch stop" and substitute therefor --etch-stop--.

Column 1, line 60, delete "etch resistant" and substitute therefor --etch-resistant--.

Column 3, line 11, delete "etch resistant" and substitute therefor --etch-resistant--.

Signed and Sealed this

Twenty-ninth Day of August, 2000

*Attest:*

Q. TODD DICKINSON

*Attesting Officer*  *Director of Patents and Trademarks*